United States Patent
Yazdi et al.

(10) Patent No.: US 10,333,404 B1
(45) Date of Patent: Jun. 25, 2019

(54) VOLTAGE-BASED AUTO-CORRECTION OF SWITCHING TIME

(71) Applicant: GOODIX TECHNOLOGY INC., San Diego, CA (US)

(72) Inventors: Siavash Yazdi, San Diego, CA (US); Faisal Hussien, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/957,900

(22) Filed: Apr. 19, 2018

(51) Int. Cl.

| | |
|---|---|
| *H02M 3/156* | (2006.01) |
| *H02M 3/158* | (2006.01) |
| *H03K 5/24* | (2006.01) |
| *H03K 5/1536* | (2006.01) |
| *H02M 3/157* | (2006.01) |
| *H02M 1/08* | (2006.01) |
| *H02M 1/00* | (2006.01) |
| *H03K 5/00* | (2006.01) |

(52) U.S. Cl.
CPC ............ *H02M 3/158* (2013.01); *H02M 1/08* (2013.01); *H02M 3/157* (2013.01); *H03K 5/1536* (2013.01); *H03K 5/2481* (2013.01); *H02M 2001/0048* (2013.01); *H03K 2005/00026* (2013.01); *H03K 2005/0028* (2013.01); *H03K 2005/00195* (2013.01)

(58) Field of Classification Search
CPC ...... H02M 3/156; H02M 3/157; H02M 3/158; H02M 3/1582; H02M 5/1538; H02M 5/2481; H02M 2001/0045; H02M 2001/0048; G05F 1/575; G05F 1/468; G05F 1/462; G05F 1/562; G05F 1/565
See application file for complete search history.

(56) References Cited

U.S. PATENT DOCUMENTS

| | | | | |
|---|---|---|---|---|
| 4,584,517 A | * | 4/1986 | Schwob | H02M 3/1563 323/222 |
| 9,748,837 B1 | * | 8/2017 | Kose | H02M 3/07 |
| 2004/0124709 A1 | * | 7/2004 | Eisenberger | H02J 9/061 307/29 |
| 2015/0311795 A1 | * | 10/2015 | Yang | H02M 3/156 323/271 |
| 2017/0294839 A1 | | 10/2017 | De Cremoux et al. | |

FOREIGN PATENT DOCUMENTS

| | | |
|---|---|---|
| CN | 103616556 A | 3/2014 |
| CN | 107735932 A | 2/2018 |
| TW | 201230681 A | 7/2012 |

OTHER PUBLICATIONS

International Search Report dated Jan. 18, 2019 in the corresponding PCT application(application No. PCT/CN2018/104420).

* cited by examiner

*Primary Examiner* — Adolf D Berhane
(74) *Attorney, Agent, or Firm* — Kilpatrick Townsend & Stockton, LLP

(57) ABSTRACT

A control device for a switching voltage regulator having a high-side switch and a low-side switch to supply a switching voltage to a load includes a comparator configured to compare the switching voltage with a reference voltage to provide an enable signal to the low-side switch, and a spike detection circuit configured to receive the switching voltage and output an offset control signal to execute a time shift to the enable signal.

20 Claims, 11 Drawing Sheets

VOLTAGE-BASED AUTO-CORRECTION OF SWITCHING TIME

FIELD OF THE INVENTION

The present invention relates generally to switching regulators. More particularly, embodiments of the present invention relate to control circuits, devices, and methods of detecting and eliminating the presence of spikes at a switching node of the switching regulators and optimizing a dead time in a switching module of the switching regulators.

BACKGROUND OF THE INVENTION

Voltage regulators have been employed for providing stable supply voltages to a large variety of electronic products. FIG. 1 schematically shows a switching voltage regulator 100, which includes a high-side switch 102 and a low-side switch 104 connected between an input voltage Vin and ground GND to be alternatively switched by a controller 106, a current sense circuit 108 senses an output current Iout flowing through an inductor L to charge a capacitor C to produce an output voltage Vout. Current sense circuit 108 senses the output current Iout to provide a current Isense to controller 106, which then turns on and off high-side switch 102 and low-side switch 104 to maintain a desired voltage level of the output voltage Vout.

However, improper turn-on and/or turn-off times of high-side switch 102 and low-side switch 104 may cause a large shoot-current flowing through the switches when the turn-on time of both switches overlaps, or overshoot current/voltage and undershoot current/voltage when the ideal switching time of both switches is not well controlled.

Thus, there is a need for solutions to overcome the above-described drawbacks.

BRIEF SUMMARY OF THE INVENTION

Embodiments of the present invention provides circuits, devices, and methods for correcting systematic offset or delay of a low-side switch in a switching voltage regulator. The offset or delay may cause glitches at the switching node of the switching voltage regulator. The glitches may cause additional power loss to the switching voltage regulator and reduce its life expectancy.

In accordance with some embodiments of the present invention, a control device for a switching voltage regulator having a high-side switch and a low-side switch to supply a switching voltage to a load may include a comparator configured to compare the switching voltage with a reference voltage to provide a disable (turn-off) signal to the low-side switch, and a spike detection circuit configured to receive the switching voltage and output an offset control signal to execute a time shift to the disable signal.

In one embodiment, the spike detection circuit includes a first input coupled to the switching voltage, a second input coupled to a threshold voltage, and an output for providing the offset control signal to the comparator.

In one embodiment, the comparator is a differential operational amplifier having a first input coupled to the switching voltage, a second input coupled to the reference voltage, and an output for providing the disable (turn-off) signal to the low-side switch. In one embodiment, the differential operational amplifier includes a variable resistive element.

In one embodiment, the spike detection circuit includes a first differential operational amplifier for detecting a positive glitch associated with a late off time of the disable signal, a second differential operational amplifier for detecting a negative glitch associated with an early off time of the disable signal, and a logic circuit coupled to the first and second differential operational amplifiers and configured to provide an indication signal indicating the presence of a glitch and whether the glitch is a positive glitch or a negative glitch. In one embodiment, the spike detection circuit further includes a digital-to-analog converter configured to convert the indication signal to an analog delay through for adjusting a resistive value of the variable resistive element array.

In one embodiment, the high-side switch is a p-channel transistor, and the low-side switch is an n-channel transistor.

Embodiments of the present invention also provide a switching regulator including a controller for providing a first driver signal and a second driver signal, a dead-time control circuit having a first input terminal connected to the first driver signal, a second input terminal connected to the second driver signal, a first output terminal, and a second output terminal, a switching module coupled to the first and second out terminals and configured to supply a switching voltage to an LC network; and a spike detection circuit configured to receive the switching voltage and provide a control signal to the dead-time control circuit.

In one embodiment, the dead-time control circuit may comprise two cross-coupled logic gates including a first logic gate having a first input connected to the first input terminal, a second input, and a first output, a second logic gate having a third input connected to the second input terminal, a fourth input, and a second output; a first delay element having a fifth input connected to the second output of the second logic gate and a third output connected to the second input of the first logic gate; and a second delay element having a sixth input connected to the first output of the first logic gate and a fourth output connected t the second input of the second logic gate. In one embodiment, the first and second logic gates are not a same type logic gate.

In one embodiment, the first delay element and the second delay element each comprise RC elements. The RC elements may include a variable resistive element. In one embodiment, the variable resistive element includes a metal oxide semiconductor (MOS) transistor or a field effect transistor.

In one embodiment, the switching module includes a p-channel transistor and an n-channel transistor connected in series between an input voltage signal and ground.

In one embodiment, the spike detection circuit includes a differential operational amplifier having a first input for receiving the switching voltage, a second input for receiving a reference voltage, and configured to provide the control signal in response to a difference between the switching voltage and the reference voltage.

In one embodiment, the spike detection circuit further includes an analog-to-digital converter configured to convert the control signal to an analog delay through for adjusting a resistance value of the variable resistive element array.

Embodiments further provide a method for controlling a turn-off time of a low-side switch in a switching voltage regulator having a high-side switch and the low-side switch connected in series between an input voltage supply and ground. The method may include providing a spike detection circuit coupled to the switching voltage regulator. The method also includes determining a glitch at a switching node of the switching voltage regulator. In one embodiment, the glitch may be a positive glitch caused by a late turn-off of the low-side switch. In another embodiment, the glitch may be a negative glitch caused by an early turn-off of the low-side switch. In yet another embodiment, the glitch may not be present when the low-side switch is turned off at the correct instant.

In one embodiment, the method may further include varying a slew rate of an output signal of a comparator in response to the glitch. In one embodiment, after determining that a glitch is present, the method may also provide a control signal to the comparator to vary the slew rate of the output signal according to the determined glitch. In one embodiment, the method may also include buffering the output signal, and providing the buffered output signal to turn off the low-side switch.

Embodiments of the present invention also provide a method for controlling a dead time of a switching regulator comprising a switching module and a controller providing first and second driver signals to the switching module. The method may include providing a dead-time control circuit between the controller and the switching module and a spike detection circuit between the switching module and the dead-time control circuit; monitoring a switching voltage at a switching node of the switching module by the spike detection circuit; and determining whether the switching voltage exceeds a threshold voltage. In one embodiment, if the method determines that the switching voltage exceeds the threshold voltage, the method includes generating a control signal to the dead-time control circuit to adjust a dead time between the first driver signal and the second driver signal; and if the method determines that the switching voltage does not exceed the threshold voltage, the method includes maintaining the dead time between the first driver signal and the second driver signal.

In one embodiment, the dead-time control circuit may include two cross-coupled logic gates including a first logic gate having a first input for receiving the first driver signal, a second input, and a first output, a second logic gate having a third input for receiving the second driver signal, a fourth input, and a second output, a first delay element having a fifth input connected to the second output of the second logic gate and a third output connected to the second input of the first logic gate, and a second delay element having a sixth input connected to the first output of the first logic gate and a fourth output connected to the second input of the second logic gate.

In one embodiment, determining whether the switching voltage exceeds a threshold voltage includes comparing the switching voltage with a threshold voltage to obtain the control signal, and converting the control signal to an analog signal for adjusting the dead time.

In one embodiment, the method further includes iteratively monitoring the switching voltage, comparing the switching voltage with the threshold voltage, and adjusting the dead time until the switching voltage is lower than first threshold voltage.

The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items. The terms "Vsw" and "LX" are used interchangeably herein.

Figure 1:
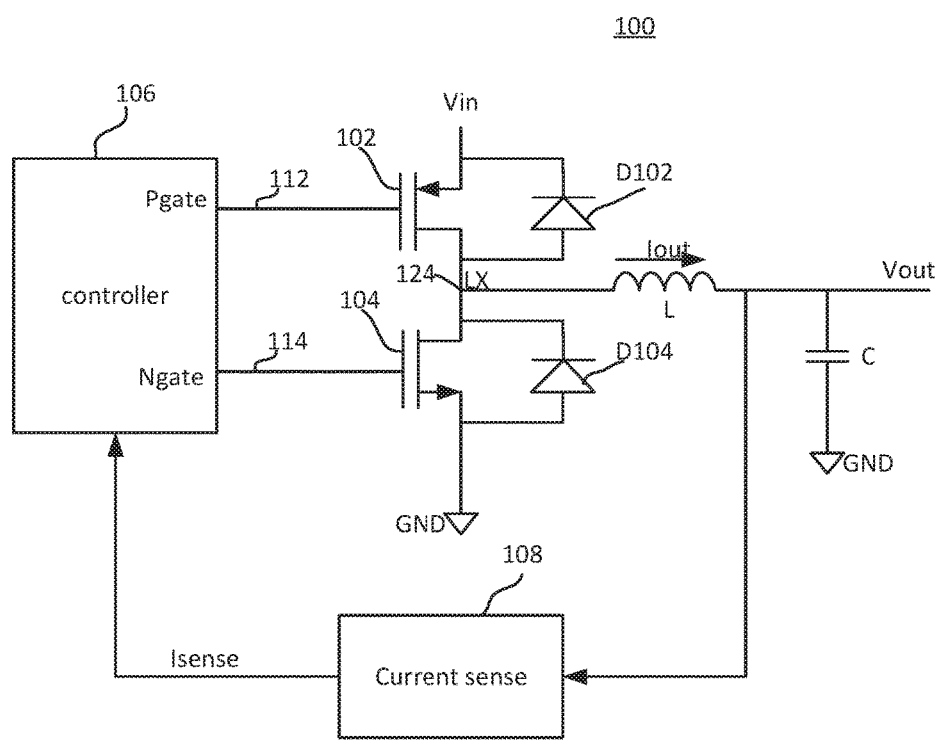
FIG. 1 is a schematic diagram of a conventional switching voltage regulator, as known in the art.

Referring back to FIG. 1, controller 106 receives feedback signal carrying Isense information to control the turn-on and turn-off times of high-side and low-side switches 102, 104 through respective gate driver signal Pgate 112 and Ngate 114. When Pgate signal 112 transitions from a high state to a low state (e.g., from Vin to 0V), high-side switch 102 is turned on, and when Pgate signal 112 transitions to a high state, high-side switch 102 is turned off. Conversely, when Ngate signal 114 transitions from a low state to a high state (e.g., from 0V to Vin), low-side switch 104 is turned on, and when Pgate signal 112 transitions to a low state, low-side switch 104 is turned off. High-side and low-side switches 102, 104 are alternatively turned on, so that they are not turned on at the same time to avoid a shoot-through current. The turning on of high-side switch sends a current Iout through the inductor L to charge the capacitor C to provide the output voltage Vout to a load.

Figure 2A:
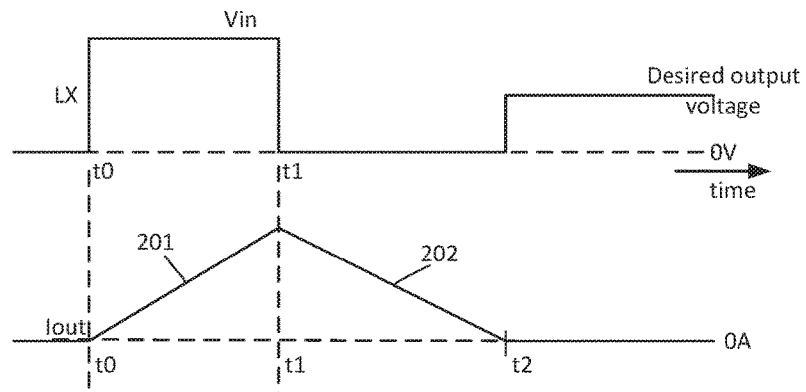
FIG. 2A is a graph illustrating the switching voltage LX and the output current Iout of the voltage regulator in FIG. 1 for the case where the turn-off time of the low-side switch is at ideal timing.

FIG. 2A is a graph illustrating the switching voltage LX and the output current Iout for the case where the low-side switch is turned off at the ideal time. Referring to FIG. 2A, at time <t0, both the high-side switch and the low-side switch are turned off. When controller 106 turns on high-side switch 102 at time t0, the input voltage Vin is supplied to the inductor L at node LX 124, the current Iout rises with a constant slope 201 and starts charging the capacitor C. At time t1, controller 106 turns off high-side switch 102 and turns on low-side switch 104, the current Iout begins to fall with a constant slope 202. At t2, when Iout crosses the zero threshold, controller 106 turns off low-side switch 104. The capacitor C smooths out the triangular current Iout to deliver a DC current to the load.

Figure 2B:
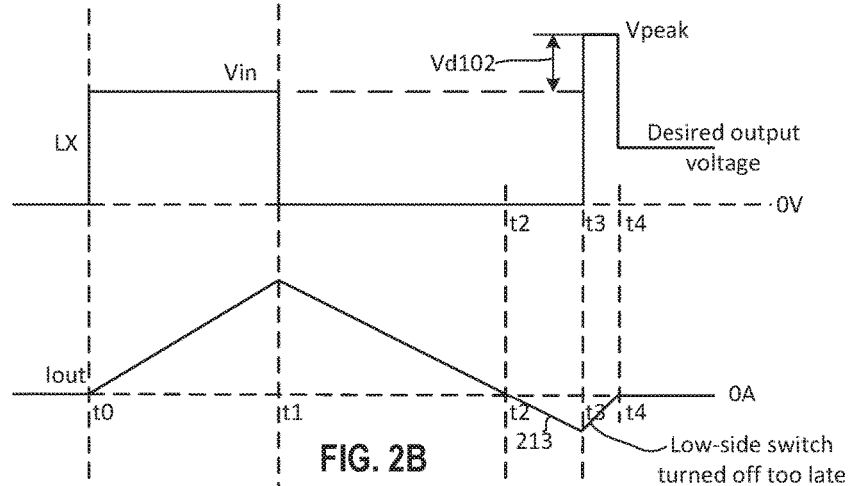
FIG. 2B is a graph illustrating the switching voltage LX, the output current Iout of the voltage regulator in FIG. 1 for the case where the low-side switch is turned off late.

FIG. 2B is a graph illustrating the switching voltage LX and the output current Iout for the case where the low-side switch is turned off late. Referring to FIG. 2B, instead of turning off low-side switch 104 at t2, controller 106 turns off low-side switch 104 late, the current Iout will undershoot the zero crossing before low-side switch 104 is turned off (at time t3). Then, the inductor L operates as a current source that continues to deliver the undershoot current value and cause the voltage LX to rise from 0V to a peak voltage Vpeak Vd102 that is above Vin by an amount equivalent to the voltage drop across the body diode D102 (e.g., 07V). The negative current 213 will continue to flow through the body diode D102, and peak voltage Vpeak Vd102 will remain until the negative current 223 decreases back to zero at t4. At this time, the switching voltage LX at node 124 is back to the desired output voltage Vout.

Figure 2C:
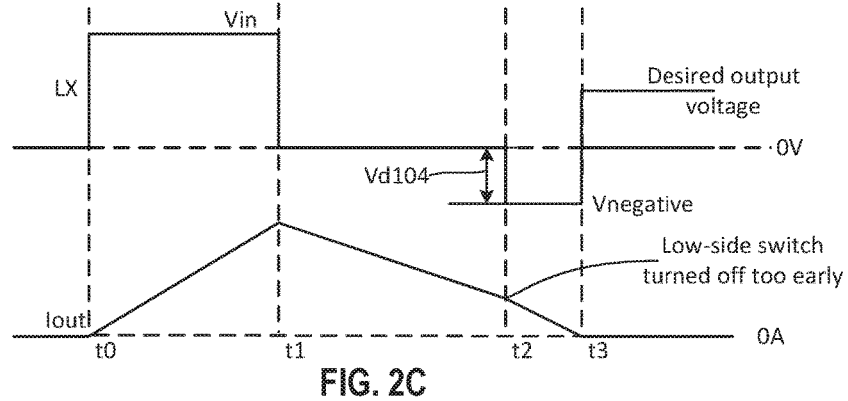
FIG. 2C is a graph illustrating the switching voltage LX and the output current Iout of the voltage regulator in FIG. 1 for the case where the low-side switch is turned off early.

FIG. 2C is a graph illustrating the switching voltage LX, and the output current Iout for the case where the low-side switch is turned off early. Referring to FIG. 2C, instead of turning off low-side switch 104 when Iout crosses the zero crossing, controller 106 turns off low-side switch 104 early, the current Iout is still positive at t2. Both the high-side and low-side switches are now turned off, the inductor will keep the current Iout to continue to flow through the body diode D104 of the low-side switch into the inductor, so that the switching voltage LX is below ground (indicated by Vd104) while the positive current decreases to zero. The current flowing through body diodes D102 (FIG. 2B) and body diode D104 causes additional power consumption and heat dissipation in the switching regulator. Besides, the overshoot and undershoot values, Vd102 and Vd104, can cause reliability issues for the pass devices (i.e., high-side and low-side switches) 102 and 104. Accordingly, the present inventors provide novel technical solutions to avoid these drawbacks.

Figure 3:
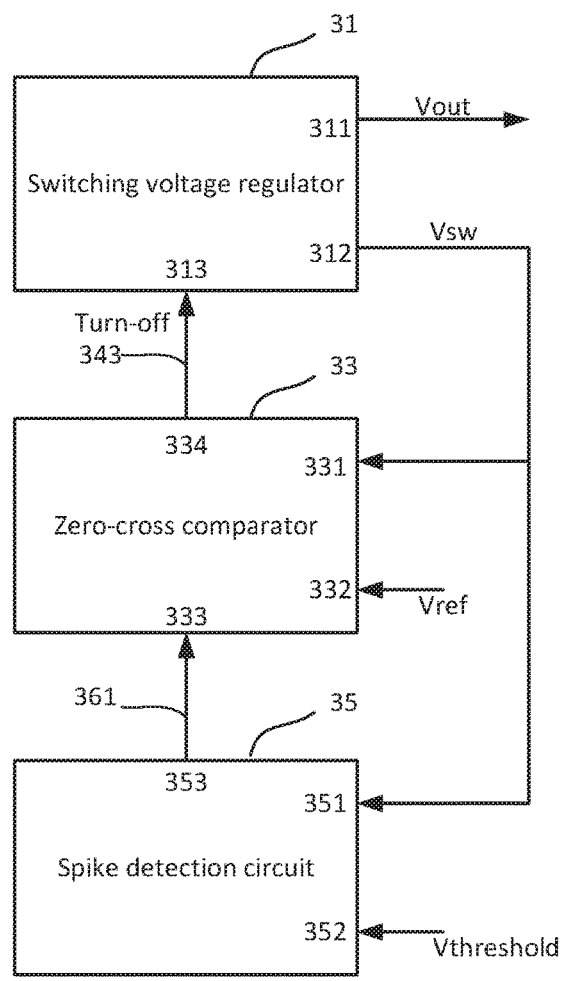
FIG. 3 is a simplified block diagram of a switching regulator according to an embodiment of the present invention.

FIG. 3 is a simplified block diagram of a switching regulator 30 that can correct systematic offsets causing an early or late switching of the low-side switch according to an embodiment of the present invention. Switching regulator 30 includes a switching voltage regulator 31, a zero-cross comparator 33, a spike detection circuit 35. Switching voltage regulator 31 may include a first output terminal 311 for providing a desired output voltage Vout to a load, a second output terminal 312 for providing a switching voltage Vsw, and a first input terminal 313. Zero-cross comparator 33 may include a second input terminal 331 for receiving the switching voltage Vsw, a third input terminal 332 for receiving a reference voltage Vref, a fourth input terminal 333, and a second output terminal 334 for providing a turn-off signal (disable) 343 to switching voltage regulator 31 through first input terminal 313. Spike detection circuit 35 may include a fifth input terminal 351 for receiving the switching voltage Vsw, a sixth input terminal 352 for receiving a threshold voltage Vthreshold, and a third output terminal 353 for providing an offset control signal 361 to zero-cross comparator 303. The terms "turn-off signal" and "disable signal" are used interchangeably herein.

Figure 3A:
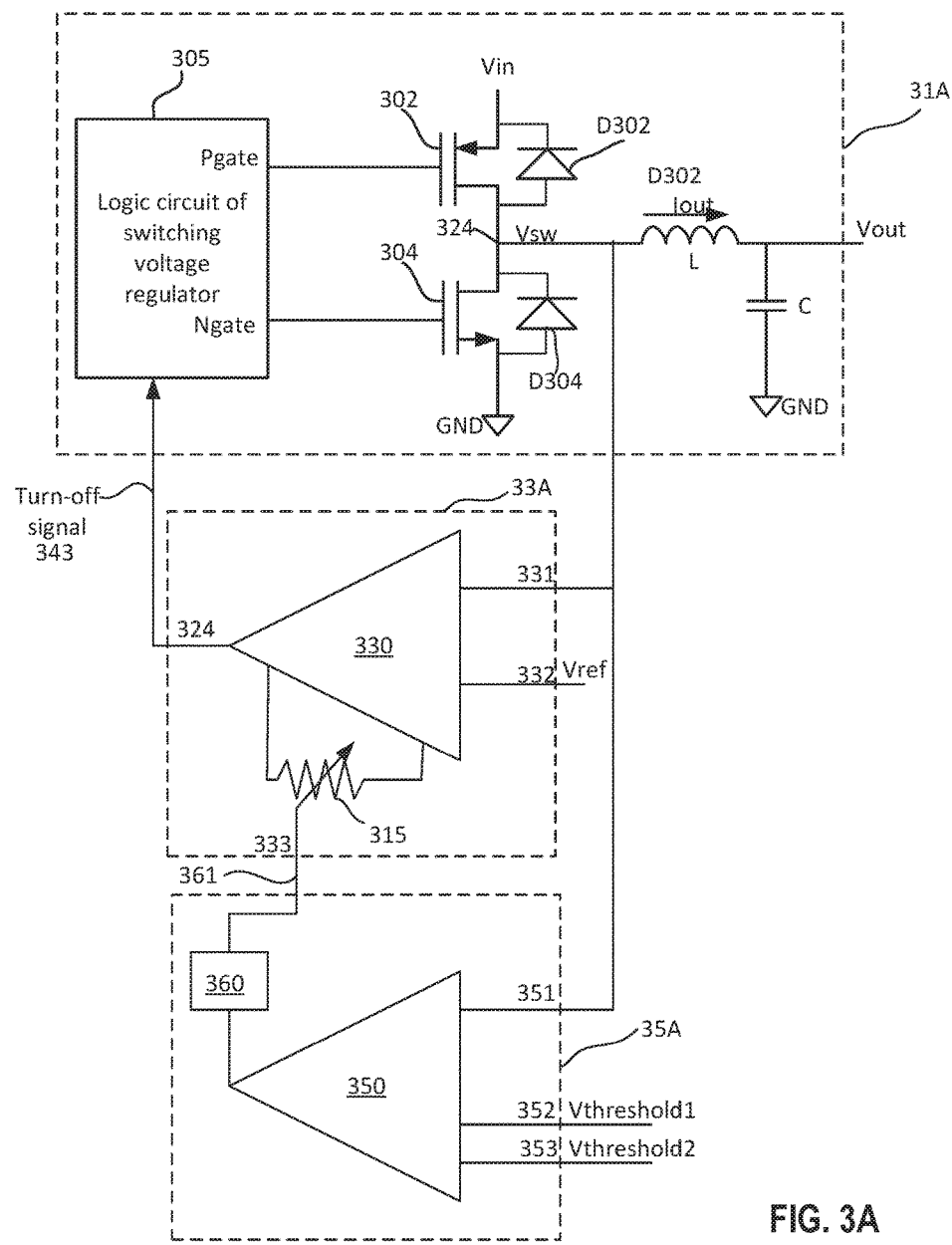
FIG. 3A is a circuit diagram of a switching voltage regulator according to an exemplary embodiment of the present invention.

FIG. 3A is a circuit diagram of a switching voltage regulator 30A according to an exemplary embodiment of the present invention. Referring to FIG. 3A, switching voltage regulator 31A includes logic circuit 305 for driving a switching module including a high-side switch 302 and a low-side switch 304, a zero-cross comparator 33A, and a spike detection circuit 35A. In some embodiments, high-side switch 302 may be a P-channel transistor, low-side switch may be an N-channel transistor. High-side switch 302 is turned on by a Pgate signal at a low state (e.g., 0V) and turned off by the Pgate signal at a high state (e.g., Vin). When high-side switch 302 is turned on, the voltage Vsw at node 324 will have substantially the voltage Vin. Low-side switch 302 is turned on by an Ngate signal at the high state (e.g., Vin) and turned off by the Ngate signal at the low state (e.g., 0V). When low-side switch 304 is turned on, the voltage Vsw at node 324 will have substantially the voltage GND.

Referring back to FIG. 2A, the current Iout flowing through the inductor L increases linearly from 0A to a certain value when high-side switch 302 is turned on and low-side switch 304 is turned off (e.g., between the time period t0-t1). The current Iout decreases linearly from the certain value to 0A when high-side switch 302 is turned off and low-side switch 304 is turned on (e.g., time period t1-t2). The capacitor C is charged by the current Iout to provide a desired output voltage Vout. The turn-on and turn-off times of high-side and low-side switches are controlled by logic circuit 305 of the switching voltage regulator. There is no undershoot or overshoot in the switching voltage Vsw at node 324 if logic circuit 305 turns off low-side switch 304 at the ideal time when the current Iout crosses zero (e.g., at time t2).

Referring back to FIG. 2B, in the case where logic circuit 305 turns off low-side switch 304 too late, the current Iout will underrshoot the zero crossing before low-side switch is turned off. The negative current will flow to ground through low-side switch 304. When low-side switch 304 is eventually turned off at time t3, the switching voltage Vsw at node 324 will rises from 0V to above the supply voltage Vin by an amount equivalent to the body diode D302. The current continues to flow across the body diode D302 of high-side switch 302, the switching voltage Vsw remains at its peak value Vpeak until the current Iout decreases to 0A at time t4. After that, the switching voltage Vsw returns back to the desired output voltage value Vout.

Referring back to FIG. 2C, in the case where logic circuit 305 turns off low-side switch 304 too early, i.e., the current Iout has not reached the zero crossing at time t2, the inductor L will maintain the continuous current flow so that the current Iout will flow across the body diode D304 of low-side switch 304. The switching voltage Vsw will remain below the ground level (denoted by Vnegative) while the current Iout decreases to 0A at time t3.

The voltage overshoot and undershoot can be detected by spike detection circuit 35A. In one example embodiment, spike detection circuit 35A includes a differential operational amplifier 350 having a first input 351 for receiving the switching voltage, a second input 352 for receiving a first threshold voltage Vthreshold1, and a third input for receiving a second threshold voltage Vthreshold2. Spike detection circuit 35A is configured to compare the switching voltage Vsw with the first and second threshold voltages and provide a decision result. For example, the first threshold voltage may be Vin or a percentage of Vin, and the second threshold voltage may be 0V. When the switching voltage Vsw is greater than the first threshold voltage, spike detection circuit 35A determines that low-side switch 304 is turned off too late. Similarly, when the switching voltage Vsw is lower than the second threshold voltage, spike detection circuit 35A determines that low-side switch 304 is turned off too early. When the switching voltage Vsw is within the range between 0V and Vout, spike detection circuit 35A determines that low-side switch 304 is turned off at the exact time. In one embodiment, spike detection circuit 35A may also include a decision result storage 360 that stores the decision result whether the turn-off time of low-side switch is at the exact time, too late, or too early and provides the stores decision result as an offset control signal 361 to zero-cross comparator 33A.

Figure 4:
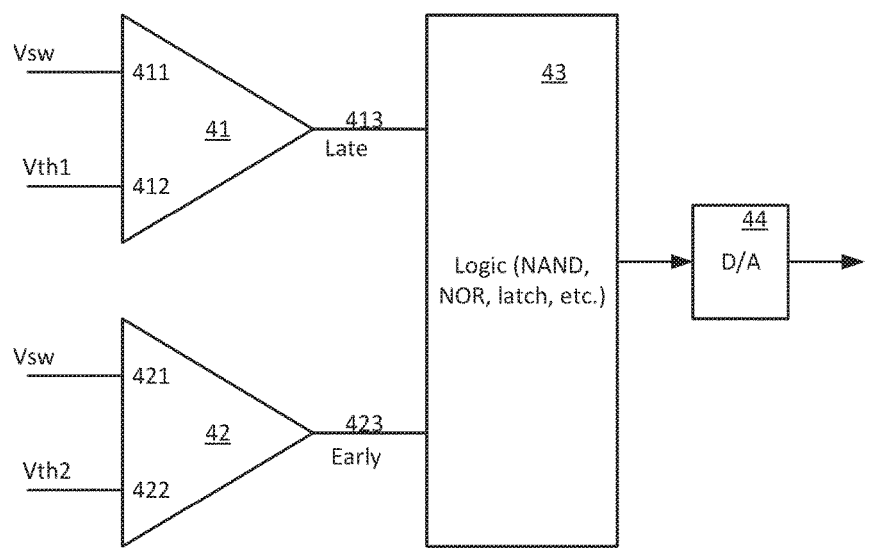
FIG. 4 is a circuit diagram illustrating a spike detection circuit according to an embodiment of the present invention.

FIG. 4 is a circuit diagram illustrating a spike detection circuit 40 according to an embodiment of the present invention. Referring to FIG. 4, spike detection circuit 40 may include a first differential operational amplifier 41 having a first input 411 for receiving the switching voltage Vsw and a second input 412 for receiving a first threshold voltage Vth1 (e.g., the first threshold voltage Vtheshold1 352 in FIG. 3A), a second differential operational amplifier 42 having a third input 421 for receiving the switching voltage Vsw and a fourth input 422 for receiving a second threshold voltage Vth2 (e.g., the second threshold voltage Vthreshold2 353 in FIG. 3A), and decision making logic 43 for making control decision. For example, the first threshold voltage Vth1 may have a voltage level about the voltage level of Vin, and the second threshold voltage Vth2 may have a voltage level about 0V. In one embodiment, first differential operational amplifier 41 is configured to operate as a comparator to compare the difference between Vsw and Vth1 and outputs a comparison result "Late" 413 when it determines that Vsw>Vth1. In one embodiment, the second differential operational amplifier 42 is configured to operate as a comparator to compare the difference between Vsw and Vth2 and outputs a comparison result "Early" 423 when it determines that Vsw<Vth2. Decision making logic 43 includes a first input 431 for receiving Late signal 413 and a second input for receiving Early signal 423. Decision making logic 43 also includes logic gates (e.g., NAND, NOR), latches, flipflops to make decisions whether the switching voltage Vsw includes a glitch (i.e., a positive voltage above Vin or negative voltage below 0V) at the node 324. In one embodiment, spike detection circuit 40 may further include a digital-to-analog circuit for converting the decision result (i.e., whether low-side switch 304 is turned off at the right time, too early, or too late) to a corresponding analog offset control signal for controlling the zero-cross comparator 33A. It is understood that the spike detection circuit and the zero-cross comparator are only operative when the high-side switch is in the turn-off state.

Referring back to FIG. 3A, zero-cross comparator 33A includes a first input 331 for receiving the switching signal Vsw, a second input 332 for receiving a reference voltage Vref, and a third input 333 for receiving an offset control signal 361 provided by spike detection circuit 35A. The reference voltage Vref may be a value in the range between 0V and Vout. In one embodiment, zero-cross comparator 33A may include a differential operational amplifier 330 and a variable resistive element 315 having a resistance value that can be varied under the control of the analog offset control signal 361 receiving at third input 333. In one embodiment, variable resistive element 315 may include an array of resistors whose equivalent resistance value determined by a digital control word. In some embodiments, a capacitor may be connected in parallel to variable resistance element 315. In an example embodiment, variable resistance element 315 may a MOS transistor, a bipolar transistor, a field effect transistor, whose resistive value can be adjusted linearly with respect to the control voltage at its gate (base).

Figure 5A:
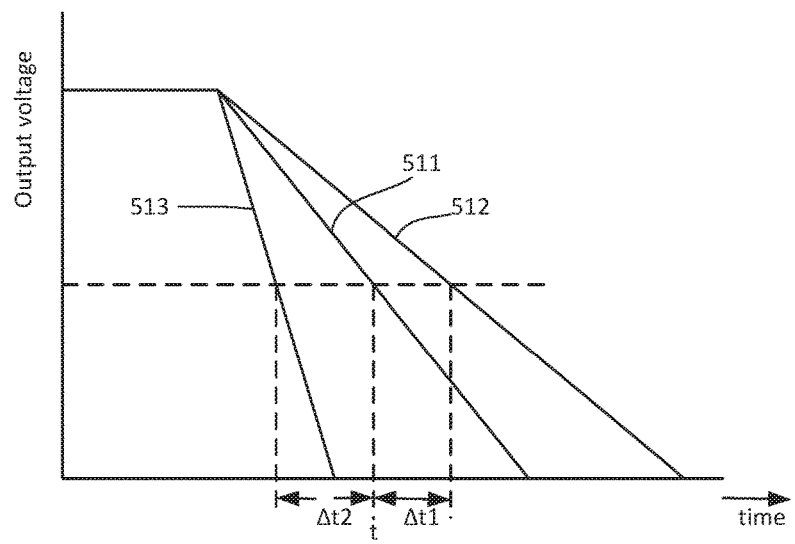
FIG. 5A is a graph illustrating the turn-off signal for the low-side switch in response to an offset control signal according to an embodiment of the present invention.
Figure 5B:
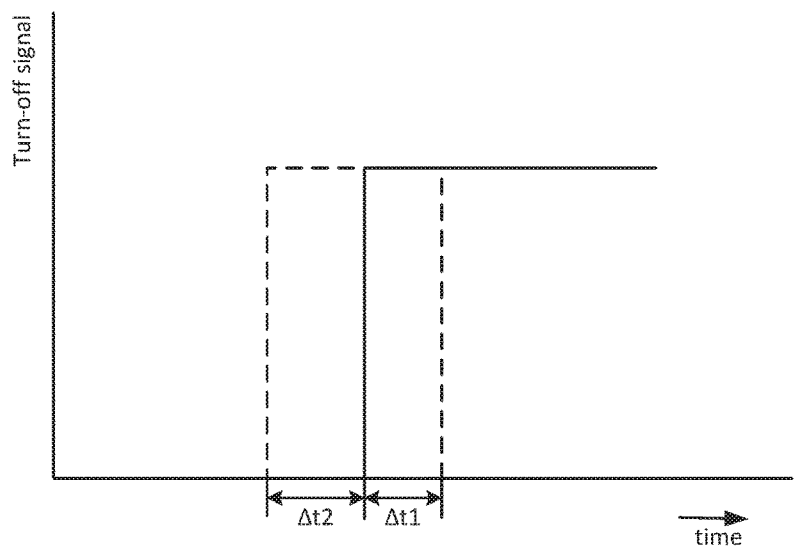
FIG. 5B is a graph illustrating adjusted slew rates shown in FIG. 5A being converted to a digital turn-off signal for the low-side switch after the output signal with adjusted slew rates passes through an inverter buffer according to an embodiment of the present invention.

FIG. 5A is a graph illustrating the turn-off signal for the low-side switch in response to an offset control signal according to an embodiment of the present invention. Referring to FIG. 5A, the slew rate of turn-off signal 343 at output 334 of zero-cross comparator 33A may be adjusted in response to offset control signal 361. For example, line 511 represents a slew rate of the output signal at a nominal value of variable resistance element 335, which corresponds to the correct turn-off time of low-side switch 304; line 512 represents a slew rate when the resistive value of variable resistive element 315 increases; and line 513 represents a slew rate when the resistive value of variable resistive element 315 decreases. FIG. 5B is a graph illustrating the adjusted slew rates shown in FIG. 5A being converted to a digital turn-off signal for the low-side switch after the output signal with adjusted slew rates passes through an inverter buffer (not shown). For example, the turn-off signal for the low-side switch may be delayed by an amount Δt1 or advanced by an amount Δt2 in relation to a nominal time t by adjusting the resistive value of variable resistive element 315. It is understood that the inverter buffer (not shown) can be implemented in the zero-cross comparator or in the switching voltage regulator.

In another embodiment, zero-cross comparator 33A may include a series-string of delay elements, e.g., a resistor array whose equivalent resistance value can be determined by a digital code word. In this case, digital-to-analog converter 44 of spike detection circuit 35A shown in FIG. 4 is omitted. Logic circuit 43 will output control signals (i.e., digital code words) for controlling the series-string of delay elements (i.e., determining the equivalent resistance value of the series-string of delay elements or resistor array) to adjust the turn-off signal timing of low-side switch 304. In yet another embodiment, zero-cross comparator 33A may include an internal offset shift to Vref (332) value. In this case, digital-to-analog converter 44 of spike detection circuit 35A shown in FIG. 4 is omitted. Logic circuit 43 will output control signals for controlling the value of the offset affecting the comparator output switching with a delay corresponding to the offset value added. This adjusts the turn-off signal timing of low-side switch 304.

Figure 6:
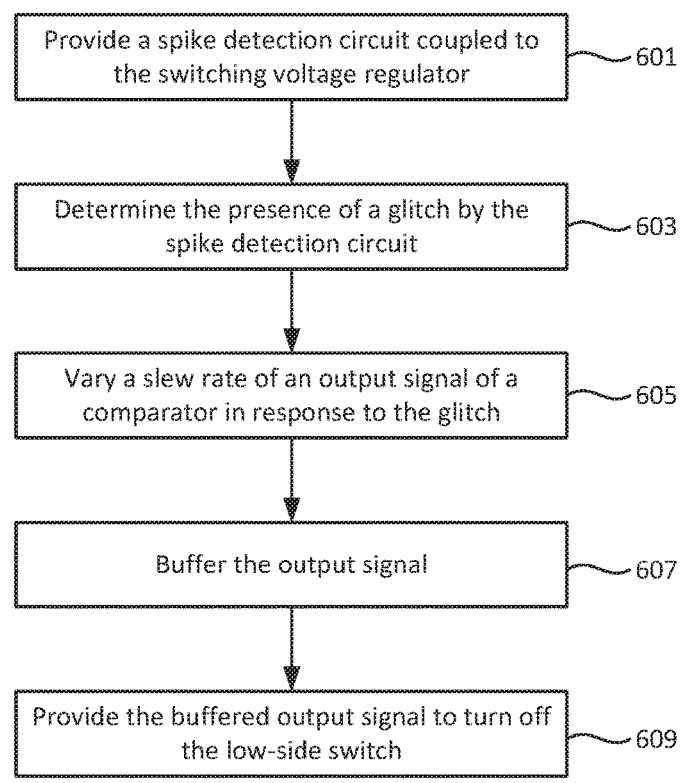
FIG. 6 is a simplified flow chart of a method for controlling a turn-off time of a low-side switch in a switching voltage regulator according to an embodiment of the present invention.

FIG. 6 is a simplified flow chart of a method 600 for controlling a turn-off time of a low-side switch in a switching voltage regulator having a high-side switch and the low-side switch connected in series between an input voltage supply and ground. Method 600 may include:

At 601: providing a spike detection circuit coupled to the switching voltage regulator. In one embodiment, the spike detection circuit may be spike detection circuit 35A shown in FIG. 3A or spike detection circuit 40 shown in FIG. 4 and described in sections above.

At 603: determining a glitch at an output terminal of the switching voltage regulator. The glitch may be a positive glitch caused by a late turn-off of the low-side switch. The glitch may be a negative switch caused by an early turn-off of the low-side switch. The glitch may not be present when the low-side switch is turned at the ideal time.

At 605: varying a slew rate of an output signal of a comparator in response to the glitch. After determining that a glitch is present, the method may also provide a control signal to the comparator to vary the slew rate of the output signal according to the determined glitch. For example, the output signal slew rate curve of the comparator can be made steeper if the glitch is determined to be a positive glitch, i.e., the low-side switch was turned off to late, or the output signal slew rate curve of the comparator can be made slower than the nominal value if the glitch is determined to be a negative glitch, i.e., the low-side switch was turned off to early.

At 607: buffering the output signal. The output signal is then buffered to drive the low-side switch. In one embodiment, the buffer may be integrated in the comparator. In another embodiment, the buffer may be integrated in the switching voltage regulator. In some embodiments, the buffer, the comparator, and the switching voltage regulator are integrated within the same integrated circuit.

At 609: providing the buffered output signal to turn off the low-side switch.

In one embodiment, a method for controlling a switching voltage regulator having a switching module having a high-side switch and a low-side switch, and a controller coupled to the switching module for turning on and off the high-side switch and the low-side switch. The method may include providing a zero-crossing comparator coupled to the controller and a spike detection circuit coupled to the zero-crossing comparator, wherein the zero-crossing comparator and the spike detection circuit each have an input coupled to an output of the switching module. The method may further include determining the presence of a glitch by the spike detection circuit, and varying a slew rate of an output signal of the zero-crossing comparator in response to the glitch. The method may further include providing the output signal of the zero-crossing comparator to the controller to turn off the low-side switch.

As described above, a late or early turn-off of the low-side switch causes the inductor current Iout to flow across the body diode of the high-side switch or the low-side switch, thereby increasing power loss in the switching voltage regulator. Another cause of power loss is associated with the non-overlap period of the high-side and low-side switches. As used herein, a dead time is defined as a time when neither the high-side switch nor the low-side switch is turned on. When both high-side and low-side switches are only momentarily on at the same time, a large shoot-through current will flow between the input supply voltage and ground. However, when a dead time is selected to exceed an optical time period, the inductor current Iout flows through the body diode of the low-side switch and causes voltage ringing at the switching node LX. Also, it causes power loss through the body diode. Embodiments of the present invention provide a circuit and method for reducing power loss associated with the dead time.

Figure 7:
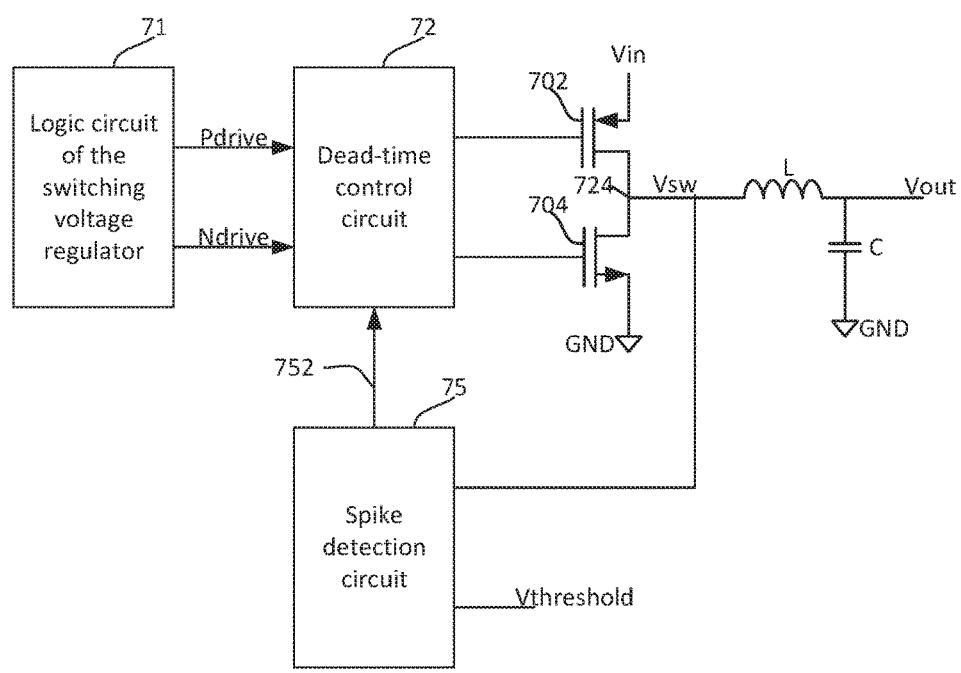
FIG. 7 is a simplified block diagram of a switching voltage regulator for minimizing power loss during a dead time according to an embodiment of the present invention.

FIG. 7 is a simplified block diagram of a switching voltage regulator 70 for minimizing power loss during a dead time according to an embodiment of the present invention. Referring to FIG. 7, switching voltage regulator 70 include a logic circuit 71 for providing driver signals Pdrive and Ndrive, a dead-time control circuit 72, a high-side switch 702, a low-side switch 704, and a spike detection circuit 75. Switching voltage regulator 70 further includes an inductor L and a capacitor C. The inductor L and the capacitor C may be integrated with switching voltage regulator 70 in the same integrated circuit, or the inductor L and the capacitor may be external to switching voltage regulator 70. In one embodiment, dead-time control circuit 72 may include two cross-coupled gates and a pair of delay elements each of which having one terminal coupled to an output of one of the two cross-coupled gates and another terminal coupled to an input of one of the two cross-coupled gates. Spike detection circuit 75 may include a differential operational amplifier operative to compare the switching voltage Vsw with a threshold voltage and provides a dead-time control signal 752 to dead-time control circuit 72.

Figure 8:
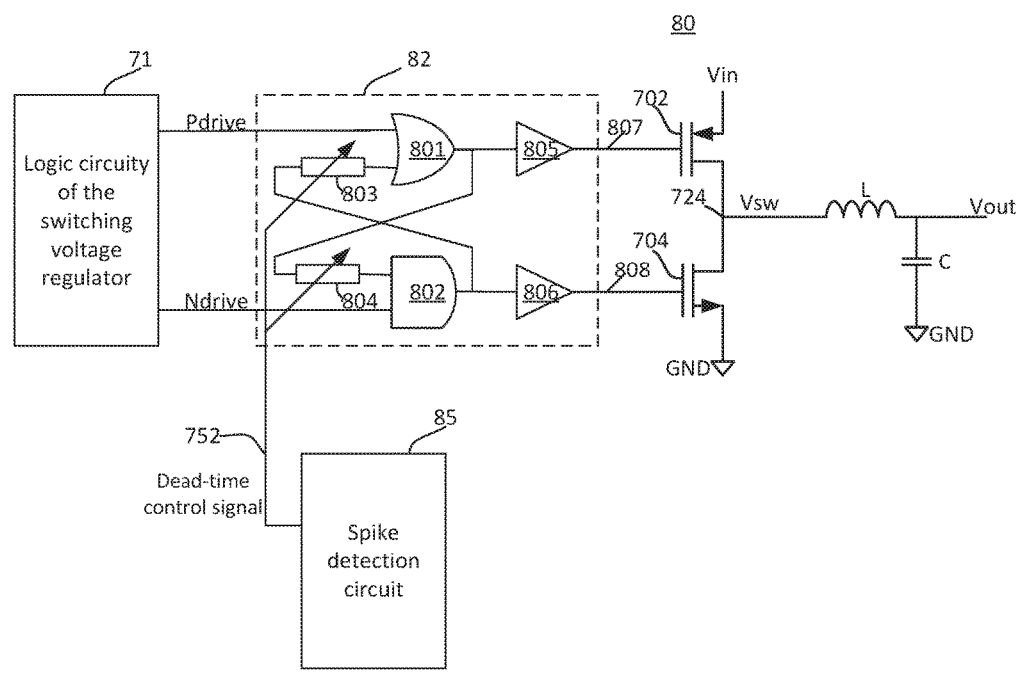
FIG. 8 is a simplified circuit diagram of a switching voltage regulator for minimizing a dead time according an embodiment of the present invention.

FIG. 8 is a simplified circuit diagram of a switching voltage regulator 80 according an embodiment of the present invention. Referring to FIG. 8, dead-time control circuit 82 includes a first gate 801, a second gate 802, a first delay element 803, and a second delay element 804. First gate 801 has a first input coupled to the Pdrive signal, a second input coupled to an output of first delay element 803, and a first output coupled to an input of second delay element 804. Second gate 802 has a third input coupled to an output of second delay element 804, a fourth input coupled to the Ndrive signal, and a second output coupled to an input of first delay element 803. Switching voltage regulator 80 may further include a first buffer 805 having an input coupled to the first output of first gate 801 and an output coupled to high-side switch 702, and a second buffer 806 having an input coupled to the second output of second gate 802 and an output coupled to low-side switch 704. Spike detection circuit 85 may include a differential operational amplifier configured to compare the switching output voltage Vsw with a threshold voltage for determining the presence of a glitch. The threshold voltage may have a level ranging around 0V. Spike detection circuit 85 may also include a logic circuitry for providing a dead-time control signal 752 to first and second delay elements 803, 804. In one embodiment, spike detection circuit 85 may be similar to spike detection circuit 35A shown in FIG. 3A. In another embodiment, spike detection circuit 85 may be similar to spike detection circuit 40 shown in FIG. 4.

Figure 9:
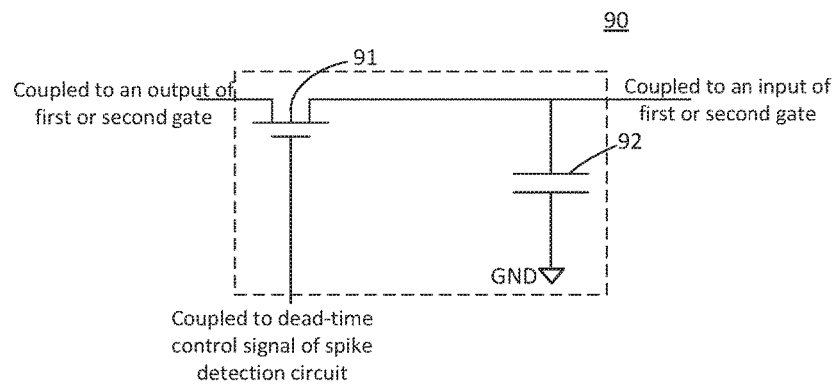
FIG. 9 is a schematic circuit diagram of an RC delay element according to an embodiment of the present invention.

In one embodiment, the first and second delay elements may be RC delay elements. FIG. 9 is a schematic circuit diagram of RC delay elements 90 according to an embodiment of the present invention. RC delay elements 90 may include a variable resistive element 91 and a capacitor C 92. Variable resistive element 91 may an MOS transistor, a field effect transistor, and the like having a resistive value that can be adjusted under the control of a voltage applied at its gate. In one embodiment, the voltage applied to variable resistive element 91 is the analog dead-time control signal 752 provided by spike detection circuit 85 (e.g., provided by the analog-to-digital converter 44 shown in FIG. 4). In one embodiment, the first and second delay elements may be a current-starved delay cell, where the delay is controlled through a current supplied to the delay cell. This can vary under the control of a voltage applied to a gate of an MOS transistor.

In one embodiment, first gate may be an OR gate, and second gate may be an AND gate. In another embodiment, first gate may be an AND gate, and second gate may be an OR gate. In yet another embodiment, first gate may be a NOR gate, and second gate may be a NAND gate. In still another embodiment, first gate may be a NAND gate, and second gate may be a NOR gate. One of skill in the art will appreciate that a NAND gate in the positive logic system may be expressed by a NOR gate in the negative system.

Figure 10:
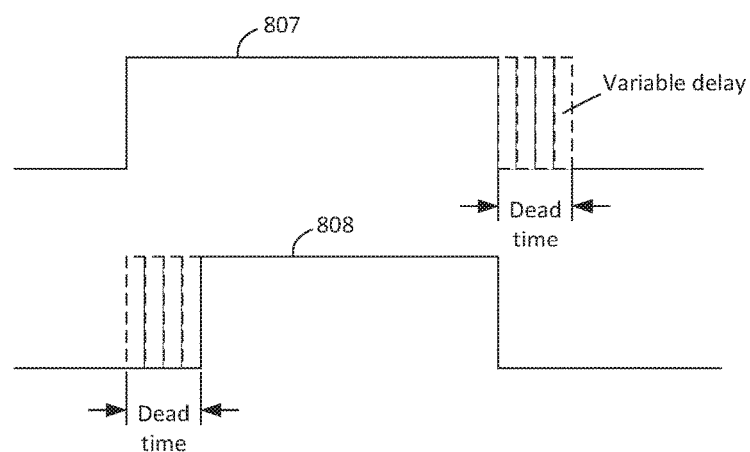
FIG. 10 is a graph illustrating waveforms of driver signals for the respective high-side switch and the low-side switch according to an embodiment of the present invention.

FIG. 10 is a graph illustrating waveforms of driver signals 807 and 808 for the respective high-side switch and the low-side switch according to an embodiment of the present invention. As shown in FIG. 10, the dead time is variable, thereby enabling the control of the turn-on or turn-off time of the high-side switch and the low-side switch. One of skill in the art will appreciate that the delay elements provide the delay only when the gate outputs change from a high level to a low level in the case of an OR gate, alternatively, the delay elements provide the delay only when the gate outputs change from a low level to a high level in the case of an AND gate. By having different types of logic gates for the first and second gates, the dead time can be controlled both in the high-to-low and low-to-high transitions.

Figure 11:
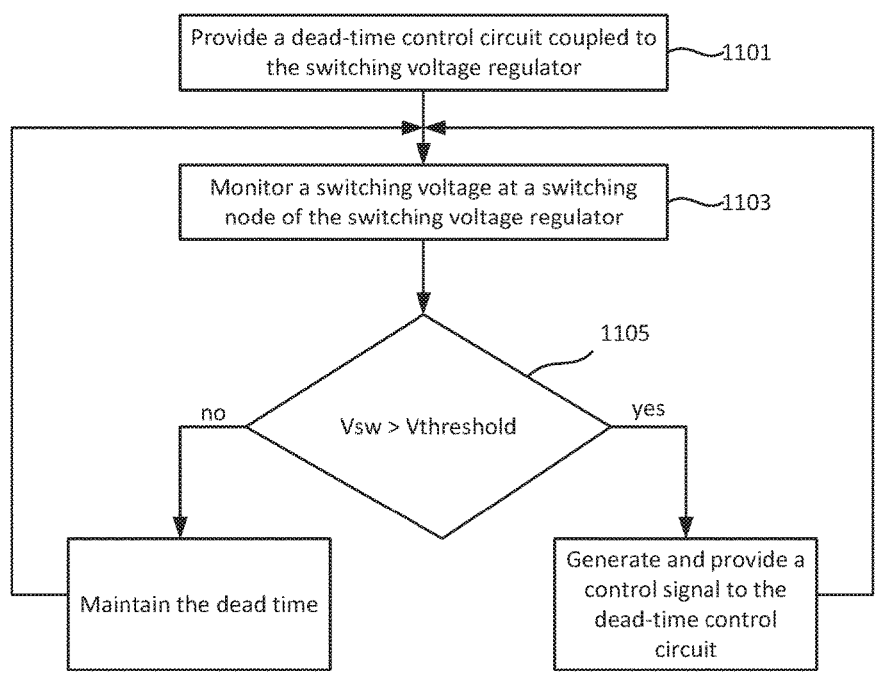
FIG. 11 is a simplified flow chart of a method for controlling a dead time of a switching voltage regulator according to an embodiment of the present invention.

FIG. 11 is a simplified flow chart of a method 1100 for controlling a dead time of a switching voltage regulator according to an embodiment of the present invention. Referring to FIG. 11, method 1100 may include:

At 1101: providing a dead-time control circuit between a logic circuit of the switching voltage regulator and the high-side and low-side switches.

At 1103: monitoring a switching voltage at an output terminal of the switching voltage regulator by a spike detection circuit.

At 1105: determining whether the switching voltage exceeds a threshold voltage by the spike detection circuit.

At 1107: if the switching voltage is determined to exceed the threshold voltage, generating a control signal and provide the control signal to the dead-time control circuit to adjust a dead time between a first driver signal and a second driver signal and go back to 1103. If the switching voltage is determined not to exceed the threshold voltage, maintaining the dead time between the first driver signal and the second driver signal and go back to 1103.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A control device for a switching voltage regulator having a switching module to supply a switching voltage to a load, the control device comprising:
 a comparator configured to compare the switching voltage with a reference voltage to provide a disable signal to the switching module; and
 a spike detection circuit configured to receive the switching voltage and output an offset control signal to execute a time shift to the disable signal,
 wherein the spike detection circuit comprises a first input coupled to the switching voltage, a second input coupled to a threshold voltage, and an output for providing the offset control signal to the comparator.

2. The control device of claim 1, wherein the comparator is a differential operational amplifier having a first input coupled to the switching voltage, a second input coupled to the reference voltage, a third input coupled to the offset control signal of the spike detection circuit, and an output for providing the disable signal to the switching module.

3. The control device of claim 2, wherein the differential operational amplifier comprises:
 a variable resistive element with an equivalent resistance determined by an analog control signal; or
 a resistor array with an equivalent resistance determined by a digital word.

4. The control device of claim 3, wherein the spike detection circuit comprises:
 a first differential operational amplifier for detecting a positive glitch associated with a first off time of the disable signal;

a second differential operational amplifier for detecting a negative glitch associated with a second off time of the disable signal;

a logic circuit coupled to the first and second differential operational amplifiers and configured to provide an indication signal indicating a presence of a glitch and whether the glitch is a positive glitch or a negative glitch.

5. The control device of claim 4, wherein the spike detection circuit further comprises a digital-to-analog converter configured to convert the indication signal to an analog signal for adjusting a resistive value of the variable resistive element.

6. The control device of claim 1, wherein the switching module comprises a high-side switch being a p-channel transistor, and a low-side switch being an n-channel transistor.

7. A switching regulator comprising:

a controller for providing a first driver signal and a second driver signal;

a dead-time control circuit comprising a first input terminal connected to the first driver signal, a second input terminal connected to the second driver signal, a first output terminal, and a second output terminal;

a switching module coupled to the first and second out terminals and configured to supply a switching voltage to an LC network; and a spike detection circuit configured to receive the switching voltage and provide a control signal to the dead-time control circuit.

8. The switching regulator of claim 7, wherein the dead-time control circuit comprises:

two cross-coupled logic gates including a first logic gate having a first input connected to the first input terminal, a second input, and a first output, a second logic gate having a third input connected to the second input terminal, a fourth input, and a second output;

a first delay element having a fifth input connected to the second output of the second logic gate and a third output connected to the second input of the first logic gate;

a second delay element having a sixth input connected to the first output of the first logic gate and a fourth output connected to the second input of the second logic gate.

9. The switching regulator of claim 8, wherein the switching module comprises:

one or more p-channel transistor and one or more n-channel transistor connected in series between an input voltage signal and ground.

10. The switching regulator of claim 8, wherein the first and second logic gates are not a same type logic gate.

11. The switching regulator of claim 8, wherein the first delay element and the second delay element each comprise an RC element or a cascaded delay stage having a plurality of variable delay units.

12. The switching regulator of claim 11, wherein the RC element comprises a variable resistive element.

13. The switching regulator of claim 12, wherein the variable resistive element comprises a metal oxide semiconductor (MOS) transistor or a field effect transistor.

14. The switching regulator of claim 12, wherein the spike detection circuit comprises:

a differential operational amplifier having a first input for receiving the switching voltage, a second input for receiving a reference voltage, and configured to provide the control signal in response to a difference between the switching voltage and the reference voltage.

15. The switching regulator of claim 14, wherein the spike detection circuit further comprises an analog-to-digital converter configured to convert the control signal to an analog signal for adjusting a resistance value of the variable resistive element.

16. The switching regulator of claim 11, wherein the plurality of variable delay units comprises:

an array of switchable capacitor elements; or current controlled delay cells.

17. A method for controlling a dead time of a switching regulator comprising a switching module and a controller providing first and second driver signals to the switching module, the method comprising:

providing a dead-time control circuit between the controller and the switching module and a spike detection circuit between the switching module and the dead-time control circuit;

monitoring a switching voltage at an output terminal of the switching module by the spike detection circuit;

determining whether the switching voltage exceeds a threshold voltage; and if the switching voltage exceeds the threshold voltage, generating a control signal to the dead-time control circuit to adjust a dead time between the first driver signal and the second driver signal; and if the switching voltage does not exceed the threshold voltage, maintaining the dead time between the first driver signal and the second driver signal.

18. The method of claim 17, wherein the dead-time control circuit comprises:

two cross-coupled logic gates including a first logic gate having a first input for receiving the first driver signal, a second input, and a first output, a second logic gate having a third input for receiving the second driver signal, a fourth input, and a second output;

a first delay element having a fifth input connected to the second output of the second logic gate and a third output connected to the second input of the first logic gate; and a second delay element having a sixth input connected to the first output of the first logic gate and a fourth output connected t the second input of the second logic gate.

19. The method of claim 17, wherein determining whether the switching voltage exceeds a threshold voltage comprises:

comparing the switching voltage with a threshold voltage to obtain the control signal; and converting the control signal to an analog signal for adjusting the dead time.

20. The method of claim 19, further comprising:

iteratively monitoring the switching voltage, comparing the switching voltage with the threshold voltage, and adjusting the dead time until the switching voltage is lower than first threshold voltage.

* * * * *